US009159957B2

(12) United States Patent
Pieh et al.

(10) Patent No.: US 9,159,957 B2
(45) Date of Patent: Oct. 13, 2015

(54) WHITE ORGANIC LIGHT EMITTING DEVICE

(75) Inventors: Sung-Hoon Pieh, Seoul (KR); Chang-Oh Kim, Daejeon (KR); Ki-Woog Song, Jeonbuk (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/280,725

(22) Filed: Oct. 25, 2011

(65) Prior Publication Data

US 2012/0097998 A1    Apr. 26, 2012

(30) Foreign Application Priority Data

Oct. 26, 2010   (KR) .................. 10-2010-0104975

(51) Int. Cl.
*H01L 51/50* (2006.01)
*H01L 51/52* (2006.01)
*H01L 27/32* (2006.01)

(52) U.S. Cl.
CPC ........ *H01L 51/5278* (2013.01); *H01L 27/3209* (2013.01); *H01L 51/504* (2013.01); *H01L 51/508* (2013.01); *H01L 51/5076* (2013.01); *H01L 2251/5376* (2013.01)

(58) Field of Classification Search
USPC .................................. 257/40, 89; 313/504
See application file for complete search history.

(56) References Cited

U.S. PATENT DOCUMENTS

| 7,608,993 | B2 * | 10/2009 | Matsuura et al. ............. 313/503 |
| 2007/0069638 | A1 | 3/2007 | Matsuura et al. |
| 2008/0297036 | A1 * | 12/2008 | Noh et al. ..................... 313/504 |
| 2010/0133522 | A1 * | 6/2010 | Pieh et al. ..................... 257/40 |
| 2010/0133566 | A1 * | 6/2010 | Towns et al. .................. 257/98 |
| 2010/0314644 | A1 * | 12/2010 | Nishimura et al. ............. 257/98 |

FOREIGN PATENT DOCUMENTS

| CN | 101006594 A | 7/2007 |
| CN | 101258621 A | 9/2008 |
| CN | 101752509 A | 6/2010 |

(Continued)

OTHER PUBLICATIONS

Kohler et al. "The Singlet-Triplet Exchange Energy in Conjugated Polymers." Advanced Functional Materials, 14: Jan. 11-18, 2004.*

(Continued)

*Primary Examiner* — Cheung Lee
*Assistant Examiner* — Stephen Bradley
(74) *Attorney, Agent, or Firm* — Morgan, Lewis & Bockius LLP

(57) ABSTRACT

A white organic light emitting device which has high color temperature characteristics and no change in color coordinates according to luminance change, includes a first electrode and a second electrode opposite to each other on a substrate, a charge generation layer formed between the first electrode and the second electrode, a second stack including a second light emitting layer formed between the charge generation layer and the second electrode, and a first stack including a first light emitting layer formed between the first electrode and the charge generation layer, wherein the first emitting layer has low singlet-triplet exchange energy to change triplet excitons into a singlet state by triplet-triplet annihilation and a dopant concentration of the first light emitting layer is adjusted according to a luminance change curve of the second stack.

15 Claims, 10 Drawing Sheets

(56) References Cited

FOREIGN PATENT DOCUMENTS

| KR | 10-2010-0062169 A | 6/2010 |
| WO | 2008/131750 A2 | 11/2008 |

OTHER PUBLICATIONS

Köhler et al. ("The Singlet-Triplet Exchange Energy in Conjugated Polymers" Advanced Functional Materials, 14:11-18, Jan. 2004).*

Lee et al. ("High Efficiency Blue Light-emitting device with balanced carrier transport." Journal of the Electrochemical Society 154 (7) J226-J228 (2007)).*

Kohler et al., "The Singlet-Triplet Exchange Energy in Conjugated Polymers," Advanced Functional Materials, 14: 11-18 (2004).

Office Action issued in counterpart Chinese Patent Application No. 201110330141.6 dated Jan. 6, 2014.

The Second Office Action dated Sep. 15, 2014 by the State Intellectual Property Office of the People's Republic of China in counterpart Chinese Patent Application No. 201110330141.6.

* cited by examiner

WHITE ORGANIC LIGHT EMITTING DEVICE

This application claims the benefit of Korean Patent Application No. 10-2010-0104975, filed on Oct. 26, 2010, which is hereby incorporated by reference as if fully set forth herein.

BACKGROUND OF THE INVENTION

1. Field of the Invention

The present invention relates to a white organic light emitting device, and more particularly, to a white organic light emitting device which has high color temperature characteristics and improved change in color coordinates according to luminance change.

2. Discussion of the Related Art

Recently, as the information age has arrived in earnest, a display field to visually express electric information signals has rapidly developed. In order to satisfy such a trend, various flat display devices having excellent performance, such as a thin profile, a light weight, and low power consumption, have been developed and have quickly replaced conventional cathode ray tube displays.

Examples of the flat display devices include liquid crystal display devices (LCDs), plasma display panel devices (PDPs), field emission display devices (FEDs), and organic light emitting device (OLEDs).

Among the flat display devices, an organic light emitting device not requiring a separate light source, being compact and achieving clear color display is considered as an application having high competitiveness.

Such an organic light emitting device essentially requires formation of an organic light emitting layer, and in order to form the organic light emitting layer, a deposition method using a shadow mask has conventionally been used.

However, if the shadow mask is used in a large area, the shadow mask sags due to load thereof, and thus it is difficult to use the shadow mask multiple times, and an error occurs during formation of an organic light emitting layer pattern. Therefore, methods of replacing the shadow mask are required.

As one of the methods of replacing the shadow mask, a white organic light emitting display device is proposed.

Hereinafter, the white organic light emitting display device will be described.

The white organic light emitting display device is characterized in that respective layers between an anode and a cathode are deposited without a mask during the formation of light emitting diodes, i.e., organic films including an organic light emitting layer are sequentially deposited in a vacuum state by varying components thereof.

The white organic light emitting display device has various purposes, such as use in a thin light source, in a backlight unit of a liquid crystal display device, and in a full color display device employing color filters.

The white organic light emitting display device employs a phosphorescent/fluorescent stack structure in which a first stack using blue fluorescent elements as a light emitting layer and a second stack using red and green phosphorescent elements as a light emitting layer are stacked. Such a white organic light emitting display device produces white light by mixing blue light emitted from the blue fluorescent elements and red and green light emitted from the red and green phosphorescent elements.

However, a luminance change curve of blue light emitted from the blue fluorescent elements and a luminance change curve of red and green light emitted from the red and green phosphorescent elements are different, and thus color coordinates of the resulting white light are changed. Further, the fluorescent elements have poor internal quantum efficiency and thus have white color coordinate properties in which red is strongly displayed. Such a problem needs to be solved by applying an additional algorithm to a panel at a position in which the white coordinates are changed in a low luminance region.

SUMMARY OF THE INVENTION

The present invention is directed to a white organic light emitting device that substantially obviates one or more problems due to limitations and disadvantages of the related art.

One object of the present invention is to provide a white organic light emitting device which has high color temperature and improved change in color coordinates according to luminance change.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, as embodied and broadly described herein, a white organic light emitting layer may include a first electrode and a second electrode opposite to each other on a substrate, a charge generation layer formed between the first electrode and the second electrode, a second stack including a second light emitting layer formed between the charge generation layer and the second electrode, and a first stack including a first light emitting layer formed between the first electrode and the charge generation layer, wherein the first light emitting layer has low singlet-triplet exchange energy to change triplet excitons into a singlet state by triplet-triplet annihilation, and a dopant concentration of the first light emitting layer is adjusted according to a luminance change curve of the second stack.

The first stack may further include a first hole injection layer, a first hole transport layer, a second hole transport layer, and a first electron transport layer on the first light emitting layer, between the first electrode and the charge generation layer.

The second stack may further include a second hole injection layer, a third hole transport layer, and a second electron transport layer on the second light emitting layer, between the charge generation layer and the second electrode. In addition, the second stack may further include an electron injection layer.

The first light emitting layer may be a light emitting layer including a blue fluorescent dopant in one host, and the second light emitting layer may be a single light emitting layer formed by doping one host with both a red phosphorescent dopant and a green phosphorescent dopant.

The first light emitting layer may be a light emitting layer including a blue fluorescent dopant in one host, and the second light emitting layer may be a single light emitting layer formed by doping one host with a yellow-green phosphorescent dopant or doping one host with a green phosphorescent dopant.

The singlet-triplet exchange energy may be in the range of 0.1 eV~0.6 eV.

The dopant concentration may be 4 wt %~10 wt % of the first light emitting layer.

The first electron transport layer may include at least two electron transport layers, one of the at least two electron transport layers may be formed of a material minimizing diffusion of a metal from the first light emitting layer, and the other of the at least two electron transport layers may be formed of an organic material enabling electron injection through doping with a metal.

One of the at least two electron transport layers adjacent to the first light emitting layer may have a higher triplet energy level than a triplet energy level of the first light emitting layer.

The first hole transport layer may have a higher triplet energy level than a triplet energy level of the first light emitting layer.

The second electron transport layer and the third hole transport layer may have a higher triplet energy level than a triplet energy level of the second light emitting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this application. The drawings illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an exemplary embodiment of the present invention will be described in detail with reference to FIGS. 1 to 10.

Figure 1:
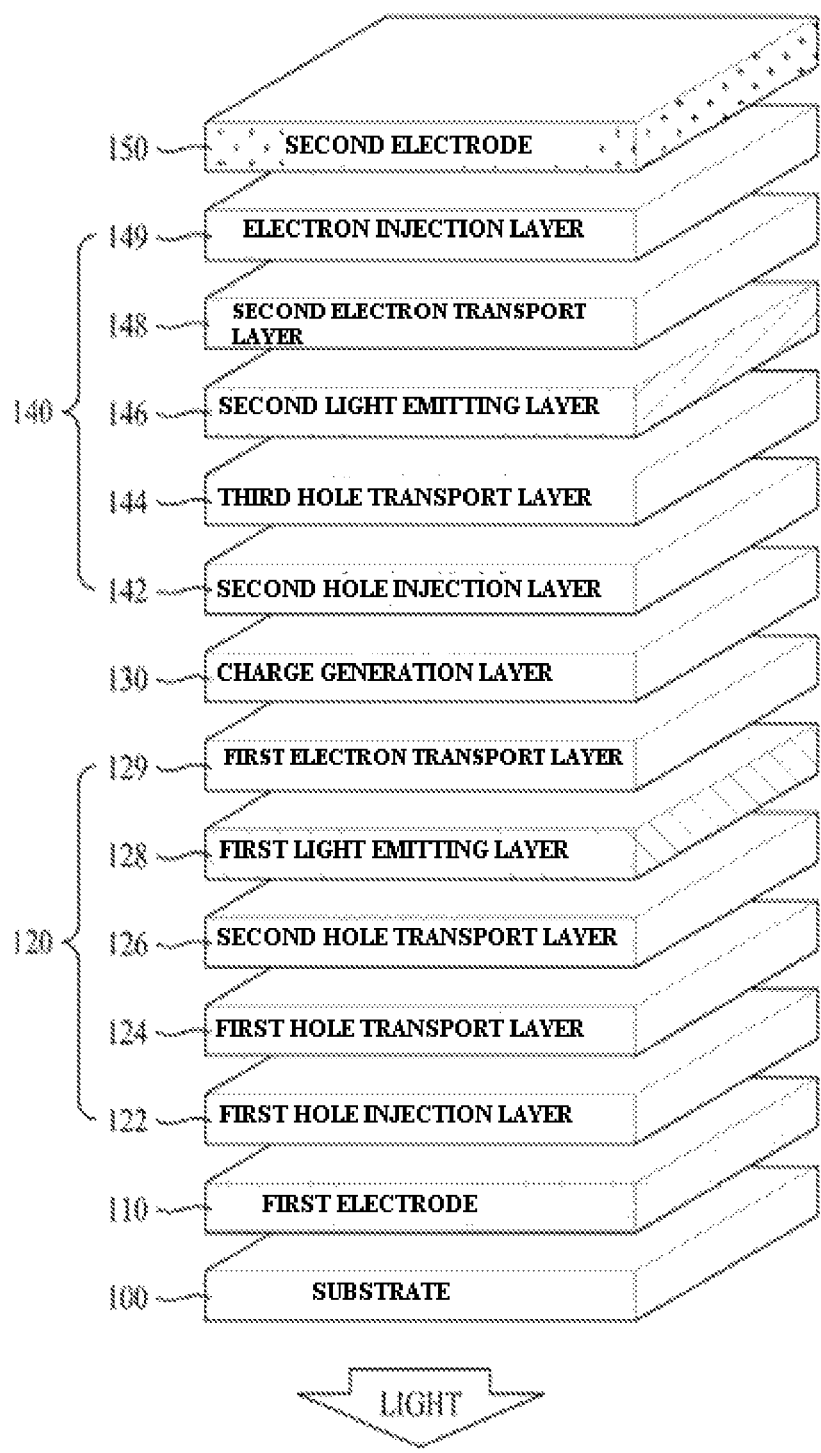
FIG. 1 is a perspective view illustrating a white organic light emitting device in accordance with one embodiment of the present invention.

FIG. 1 is a perspective view illustrating a white organic light emitting device in accordance with one embodiment of the present invention.

With reference to FIG. 1, the white organic light emitting device in accordance with the embodiment of the present invention includes a first electrode 110 and a second electrode 150 opposite to each other on a substrate 100, and a first stack 120, a charge generation layer (CGL) 130 and a second stack 140 stacked between the first electrode 110 and the second electrode 150.

The first electrode 110 serving as an anode may be formed of a transparent conductive material, such as a transparent conductive oxide (hereinafter, referred to as TCO) including, but not limited to, indium tin oxide (hereinafter, referred to as ITO) and/or indium zinc oxide (hereinafter, referred to as IZO).

The second electrode 150 serving as a cathode may be formed of a reflective metal, including, but not limited to, gold (Au), aluminum (Al), molybdenum (Mo), chrome (Cr) and copper.

The first stack 120 may be formed by sequentially stacking a first hole injection layer (HIL1) 122, a first hole transport layer (HTL1) 124, a second hole transport layer (HTL2) 126, a first light emitting layer (EML1) 128 and a first electron transport layer (ETL1) 129.

The first light emitting layer 128 may include a blue fluorescent dopant within one host. A detailed description of the first light emitting layer 128, the first and second hole transport layer 124 and 126 and the first electron transport layer 129 will be given below with reference to FIGS. 2 to 9.

In the case of the structure of the present invention in which many layers are stacked, two hole transport layers (i.e., the first and second hole transport layers 124 and 126) are formed in order to improve the moving velocity of holes. However, the number of the hole transport layers is not limited to only two, and may be varied according to the user's needs. One of the first and second hole transport layers 124 and 126 which is adjacent to the first light emitting layer 128 may be formed to have a higher triplet energy level than a triplet energy level of the host of the first light emitting layer 128, for example, by 0.01~0.4 eV.

The first electron transport layer 129 may include at least two layers, one of which may minimize the diffusion of an alkali metal, such as lithium (Li), from the light emitting layer, and the other of the two layers may be formed of a BPhen-based organic material enabling electron injection through doping with an alkali metal, such as lithium (Li). By utilizing these at least two layers, the first electron transport layer 129 adjacent to the first light emitting layer 128 may be formed to have a higher triplet energy level than the triplet energy level of the host of the first light emitting layer 128, for example, by 0.01~0.4 eV.

The second stack 140 may be formed by sequentially stacking a second hole injection layer 142, a third hole transport layer 144, a second light emitting layer 146, a second electron transport layer 148 and an electron injection layer 149 between the charge generation layer 130 and the second electrode 150.

The second light emitting layer 146 may be a single light emitting layer formed by doping one host with both a phosphorescent green dopant and a phosphorescent red dopant.

Further, the second light emitting layer 146 may be a single light emitting layer formed by doping one host with one greenish-yellow phosphorescent dopant or by doping one host with one green phosphorescent dopant. The phosphorescent dopant in the second stack 140 can be changed to another color dopant, if it is possible to emit white light with the first stack 120.

The third hole transport layer 144 and/or the second electron transport layer 148 may be formed to have a higher triplet energy level than a triplet energy level of the host of the second light emitting layer 146, for example, by 0.01~0.4 eV.

Figure 2:
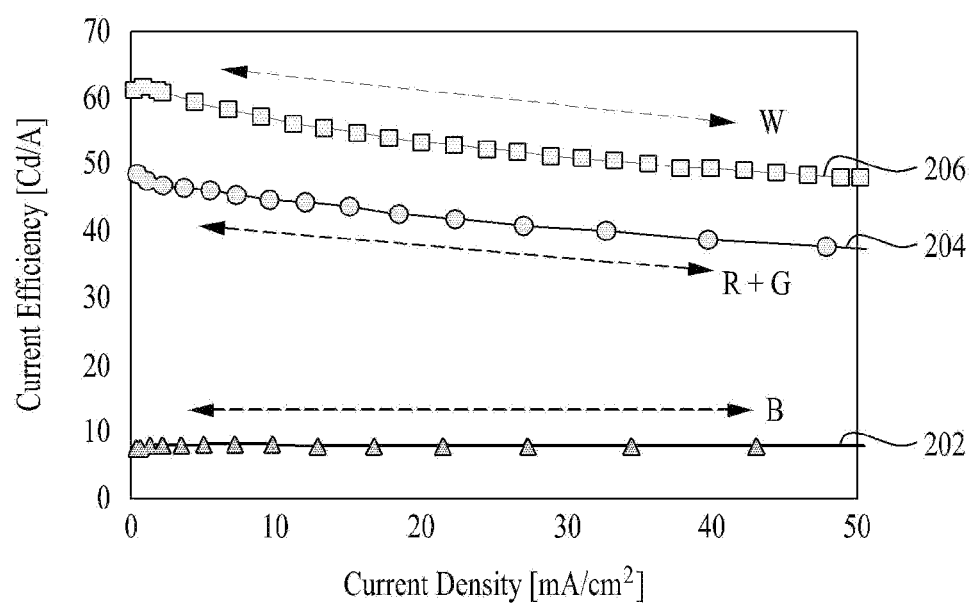
FIG. 2 is a graph illustrating efficiency change characteristics of exemplary fluorescent elements and phosphorescent elements according to luminance.
Figure 3:
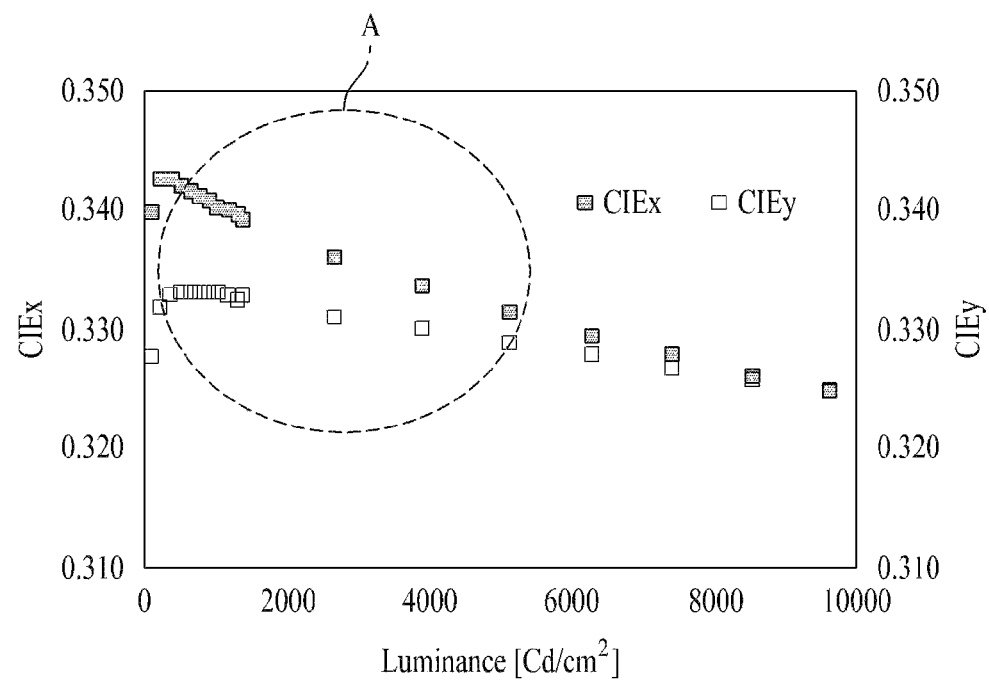
FIG. 3 is a view illustrating color coordinates of the fluorescent elements shown in FIG. 2.

FIG. 2 shows a graph illustrating efficiency change characteristics of exemplary fluorescent elements and phosphorescent elements according to luminance, and FIG. 3 shows color coordinates of the fluorescent elements shown in FIG. 2.

The white organic light emitting device in accordance with some embodiment of the present invention has a structure including red, green, blue light emitting layers, and produces white light using light emitting layers of two complementary colors. In one embodiment, the white organic light emitting device produces white light by emitting blue light from the first stack 120 and emitting red light and green light from the second stack 140.

Referring to FIG. 1, according to some embodiments of the present invention, the first light emitting layer 128 of the first stack 120 is a light emitting layer including a blue fluorescent dopant within one host, and the second light emitting layer 146 of the second stack 140 is a single light emitting layer formed by doping one host with both a green phosphorescent dopant and a red phosphorescent dopant. In this embodiment, the first light emitting layer 128 is a fluorescent layer and the second light emitting layer 146 is a phosphorescent layer.

As described above, the first light emitting layer 128 of the first stack 120 is formed as the fluorescent layer and the second light emitting layer 146 of the second stack 140 is formed as the phosphorescent layer. The exemplary white organic light emitting device with such structures showed efficiency change characteristics, as shown in FIG. 2.

In more detail, a first graph 202 shown in FIG. 2 represents a slope illustrating efficiency change characteristics of the first stack 120 having the fluorescent layer according to luminance, and a second graph 204 shown in FIG. 2 represents a slope illustrating efficiency change characteristics of the second stack 140 having the phosphorescent layer according to luminance. Further, a third graph 206 shown in FIG. 2 represents a slope illustrating efficiency change characteristics of the exemplary white organic emitting light device according to luminance. In the exemplary white organic emitting light device, the first stack 120 and the second stack 140 are stacked.

As shown in FIG. 2, the first graph 202 for the blue fluorescent layer showed no change of efficiency toward a low luminance region, but the second graph 204 for the red and green phosphorescent layers showed large change of efficiency toward the low luminance region as compared to the first graph 202 for the blue fluorescent layer. Due to the difference of the efficiency change slopes between the fluorescent elements and the phosphorescent elements according to luminance, the change in color coordinates according to luminance occurs in a region "A" shown in FIG. 3.

In order to compensate for the above change in color coordinates, the first stack 120 in accordance with one embodiment of the present invention may be formed to increase the fluorescent efficiency of the first light emitting layer 128 and to fit the efficiency change slope of the first stack 120 according to luminance to that of the second light emitting layer 146 of the second stack 140. The fluorescent efficiency can be increased simultaneously along with fitting the efficiency change slope of the first stack 120 to that of the second light emitting layer 146. In more detail, the first stack 120 may raise internal quantum efficiency (IQE) in order to increase fluorescent efficiency of the first light emitting layer 128, and may adjust an amount of a dopant in order to fit the efficiency change slope of the first stack 120 according to luminance to that of the second light emitting layer 146 of the second stack 140. The first stack 120 may have a structure in which triplet-triplet annihilation (TTA) efficiently occurs in order to raise IQE. The structure of the first stack 120 to increase IQE in accordance with one embodiment of the present invention will be described in connection with FIGS. 4 and 5, and the adjustment of the amount of the dopant of the first stack 120 to fit the efficiency change slope of the first stack 120 according to luminance to that of the second stack 140 according to luminance will be described in connection with FIG. 6.

Figure 4:
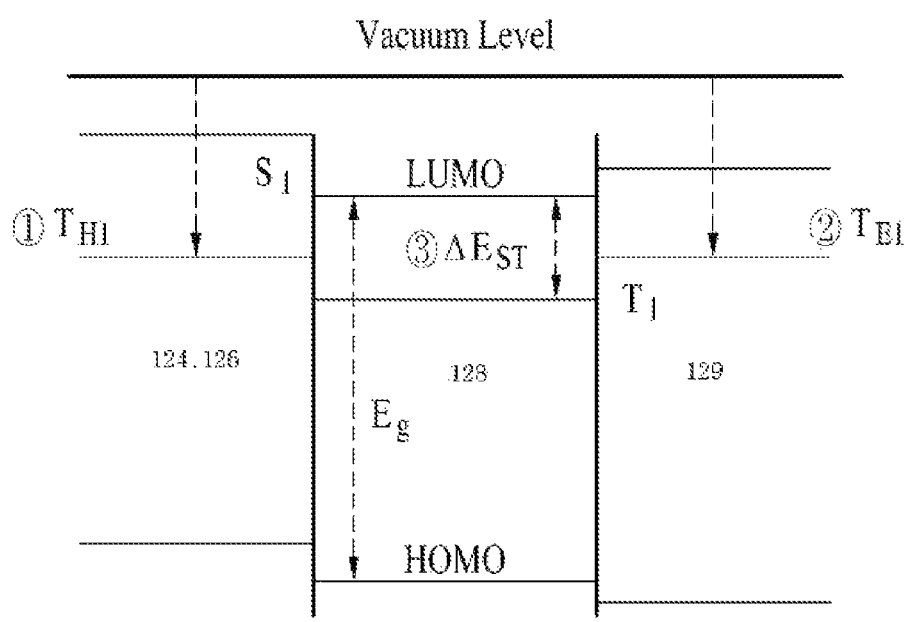
FIG. 4 is a sectional view illustrating a first stack structure in accordance with one embodiment of the present invention.
Figure 5:
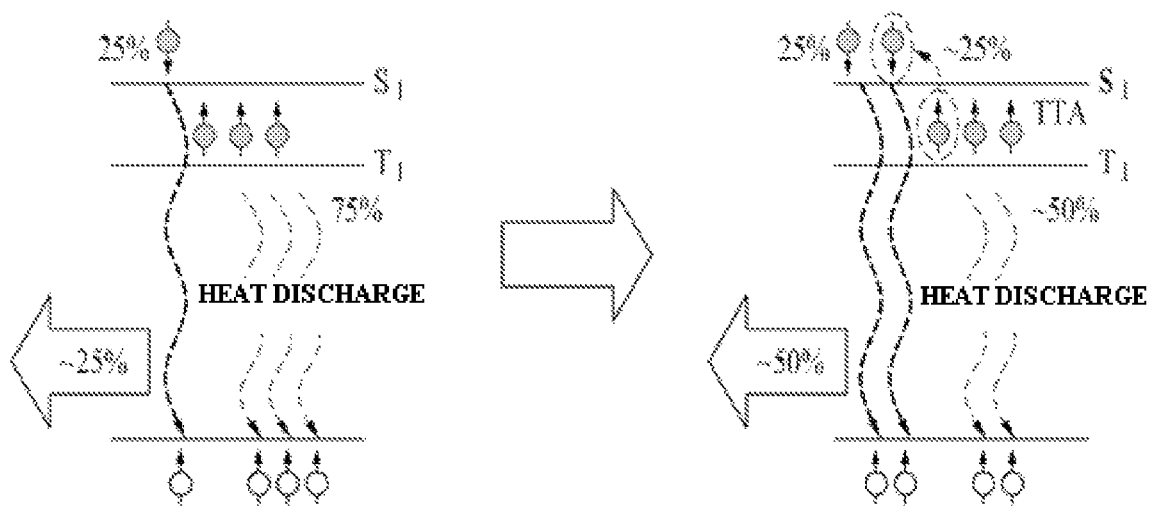
FIG. 5 is a sectional view illustrating internal quantum efficiency of the first stack structure in accordance with one embodiment of the present invention.

FIG. 4 is a sectional view illustrating the first stack structure in accordance with one embodiment of the present invention, and FIG. 5 is a sectional view illustrating internal quantum efficiency of the first stack structure in accordance with one embodiment of the present invention.

The first stack 120 in accordance with one embodiment of the present invention has a structure in which triplet-triplet annihilation (TTA) efficiently occurs in the first light emitting layer 128. That is, the internal quantum efficiency (hereinafter, referred to as IQE) is improved due to delayed fluorescence through TTA.

That is, in order to achieve an improvement in efficiency through TTA, the white organic light emitting device may have a structure in which TTA efficiently occurs in the light emitting layer 128. In order to easily achieve exchange from a triplet to a singlet through TTA, the singlet-triplet exchange energy ΔEst of each of the host and the dopant of the light emitting layer 128 should be low. However, in order to effectively collect triplet excitons in the light emitting layer 128, triplet energy of the hole transport layer 124, and the hole transport layer 126, and/or the electron transport layer 129 may be higher than triplet energy of the host of the light emitting layer (e.g. blue host).

Thereby, in order to achieve improvement in efficiency through TTA, the first stack 120, as shown in the embodiment of FIG. 4, has a structure in which the hole transport layers 124 and 126 and the electron transport layer 129 adjacent to the first light emitting layer 128 are formed in consideration of the triplet energy of the host to easily change the triplet excitons into a singlet state through TTA. For this purpose, the exchange energy ΔEst of the host of the first light emitting layer 128 may have a value in the range of 0.1 eV~0.6 eV.

According to some embodiments of the present invention, one of the hole transport layers, 124 or 126, adjacent to the first light emitting layer 128 is formed to have a higher triplet energy level than a triplet energy level T1 in the first light emitting layer 128, as shown in FIG. 4, and may be formed in consideration of a lowest unoccupied molecular orbital (LUMO) level with the first hole injection layer 122. In this way, the triplet energy level TH1 of the first or second hole transport layer 124 or 126 is higher than the triplet energy level T1 in the first light emitting layer 128, thereby preventing diffusion of holes in the first light emitting layer 128 to the first or second hole transport layer 124 or 126. Accordingly, the carriers of the first light emitting layer 128 may be distributed within the first light emitting layer 128 without diffusion to the adjacent hole transport layer 124 or 126. Herein, S1 is a singlet energy level in the first emitting layer 128.

The first electron transport layer 129 may also be formed to have a higher triplet energy level than the triplet energy level T1 in the first light emitting layer 128, as shown in FIG. 4, and may be formed in consideration of block characteristics so as to block holes from the first light emitting layer 128. In this way, the triplet energy level TE1 of the first electron transport layer 129 is higher than the triplet energy level T1 of the first light emitting layer 128, thereby preventing diffusion of the holes in the first light emitting layer 128 to the first electron transport layer 129. Accordingly, the carriers of the first light emitting layer 128 may be distributed within the first light emitting layer 128 without diffusion to the adjacent electron transport layer 129.

The first stack 120 having the above structure may improve internal quantum efficiency (hereinafter, referred to as IQE) to 25%~50% due to the delayed fluorescence through TTA, as shown in FIG. 5. Mobility of electrons may also be optimized under the above-described first stack structure, thereby obtaining high-efficiency fluorescent elements.

Figure 6:
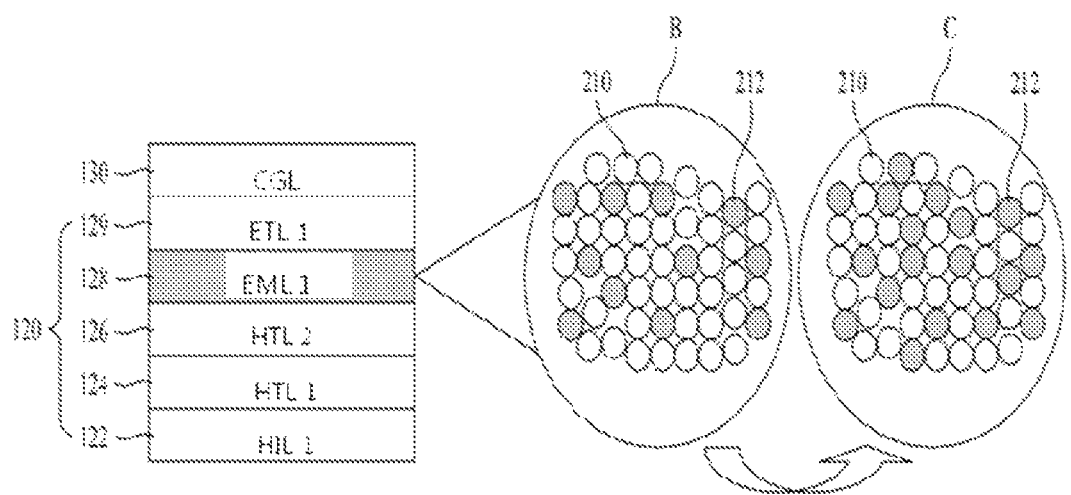
FIG. 6 is a sectional view illustrating an amount of a dopant in the first stack in accordance with one embodiment of the present invention.

FIG. 6 is a sectional view illustrating an amount of a dopant in the first stack in accordance with one embodiment of the present invention.

In the first stack 120 in accordance with one embodiment of the present invention, the first light emitting layer (EML1) 128 is formed through a combination of a dopant 212 and a host 210 in consideration of the efficiency change slope of the second stack 140 according to luminance. That is, in general, the fluorescent element has characteristics of the slope of the first graph 202 of FIG. 1, and the phosphorescent element has characteristics of the slope of the second graph 204 of FIG. 1. With reference to FIG. 1, the efficiency change slope of the fluorescent element according to luminance and the efficiency change slope of the phosphorescent element according to luminance are different.

Thereby, in the first stack 120 in accordance with the embodiment of the present invention, in order to control the slope of the first curve 202 of the fluorescent elements to be close to the slope of the curve 204 of the phosphorescent elements which is decreased to the high luminance region, the amount of the dopant 212 of the first light emitting layer 128 may be adjusted. That is, the amounts of the dopant 212 and the host 210 may be varied so as to allow the first light emitting layer 128 to represent the same luminance curve as the phosphorescent elements of the second light emitting layer 146.

In more detail, the concentration of the dopant 212 of the first light emitting layer 128 may be adjusted to 4 wt %~10 wt % of the first light emitting layer 128. In this way, concentration quenching using the concentration of the dopant 212 may be applied. That is, in the case of both the phosphorescent elements and the fluorescent elements, the light emitting efficiency may be decreased when the concentration of the dopant 212 is excessively high. Carriers move between molecules through hopping, and when the concentration of the dopant 212 is excessively high, the carriers may collide with each other within dopant particles and thus degradation occurs. If such concentration quenching is applied, the probability of collision of the carriers in the restricted light emitting layer 128 is varied according to the current density, and thus efficiency may be varied. As the concentration of the dopant 212 of the first light emitting layer 128 is increased, the slope of efficiency change according to luminance change due to concentration quenching is decreased toward the high luminance region. Thereby, the concentration of the dopant 212 of the first light emitting layer 128 may be varied according to luminance characteristics of the second light emitting layer 140. As described above, by increasing the concentration of the dopant 212, the first light emitting layer 128 may have the graph having the same slope of efficiency change according to luminance change as the slope of the second stack 140, thereby solving the problem of white color coordinates.

Figure 7:
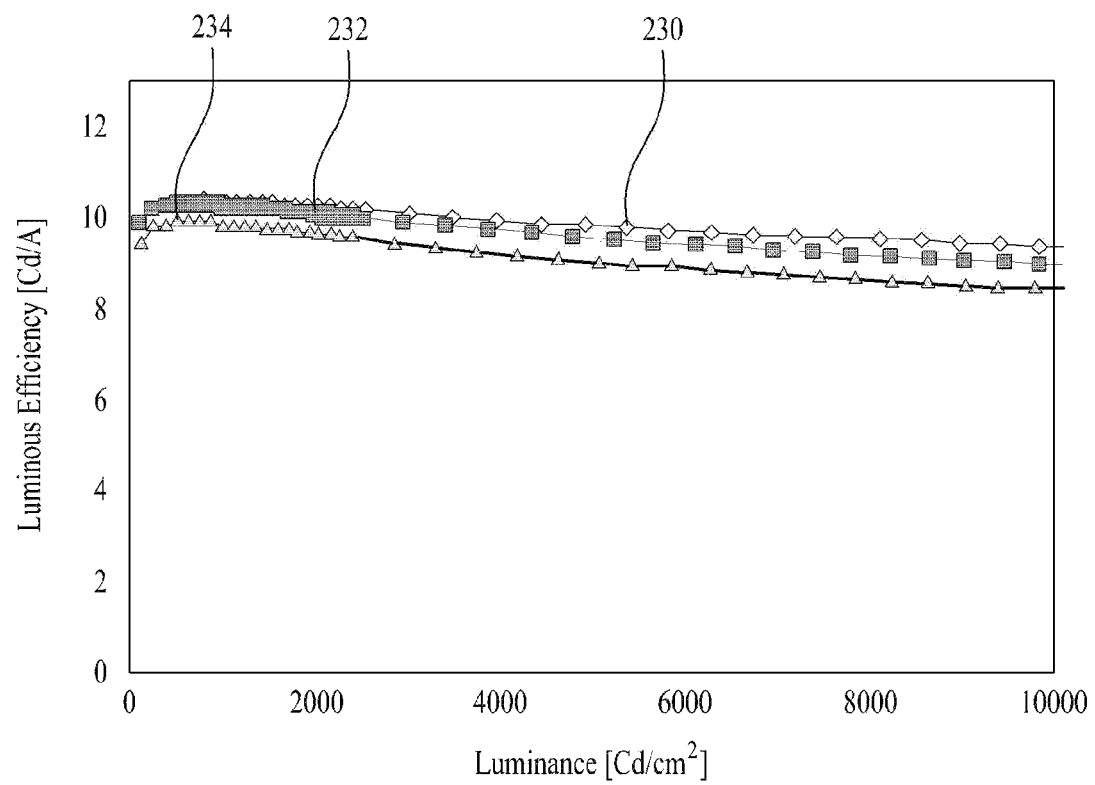
FIG. 7 is a graph illustrating luminous efficiency when the dopant concentration of a first light emitting layer includes a first dopant D1 and a first host H1 in accordance with one embodiment of the present invention.

FIG. 7 is a graph illustrating luminous efficiency when the dopant concentration of a first light emitting layer includes a first dopant D1 and a first host H1 in accordance with one embodiment of the present invention.

FIG. 7 illustrates graphs representing first light emitting layers formed by combinations of the first dopant D1 and the first host H1, i.e., representing variations of luminous efficiency change if an amount of the first dopant D1 in the first light emitting layer is varied. In more detail, in FIG. 7, a first graph 230 is a luminance curve when the first dopant D1 in the first light emitting layer has a concentration of 4%, a second graph 232 is a luminance curve when the first dopant D1 in the first light emitting layer has a concentration of 6%, and a third graph 234 is a luminance curve when the first dopant D1 in the first light emitting layer has a concentration of 8%. As described above, it is understood that the slope of the luminous efficiency curve gets steeper as the amount of the dopant D1 in the first light emitting layer increases. Herein, the concentration of the first dopant D1 is considered with regard to the first host H1.

Further, Table 1 represents the first light emitting layers according to the various amounts of the first host H1 and the first dopant D1. Table 1 represents driving voltage V, luminance per unit area Cd/A, quantum efficiency QE(%), and color coordinates (CIEx, CIEy) depending on the different concentrations of the first host H1 and the first dopant D1.

TABLE 1

| Host | Dopant | Volt (V) | Cd/A | QE (%) | CIEx | CIEy |
|---|---|---|---|---|---|---|
| BH1 | BD1 (4%) | 3.8 v | 10.3 | 10.3 | 0.127 | 0.152 |
|  | BD1 (6%) | 3.8 v | 10.2 | 10.0 | 0.126 | 0.154 |
|  | BD1 (8%) | 3.8 v | 9.9 | 9.4 | 0.125 | 0.161 |

Figure 8:
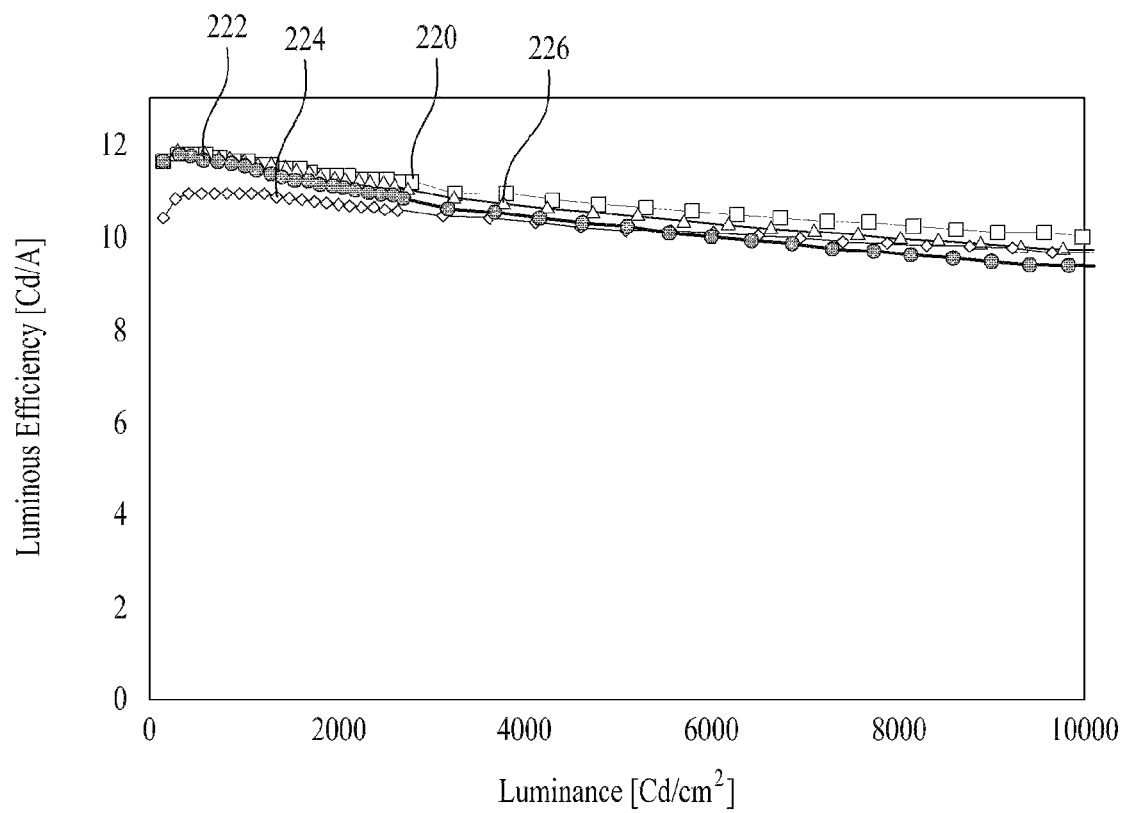
FIG. 8 is a graph illustrating luminous efficiency when the dopant concentration of a first light emitting layer includes the first dopant D1 and a second host H2 in accordance with one embodiment of the present invention.

FIG. 8 is a graph illustrating luminous efficiency when the dopant concentration of a first light emitting layer includes the first dopant D1 and a second host H2 in accordance with one embodiment of the present invention.

FIG. 8 illustrates graphs of first light emitting layers formed by combinations of the first dopant D1 and the second host H2, i.e., representing variations of luminous efficiency change if an amount of the first dopant D1 in the first light emitting layer is varied. In more detail, in FIG. 8, a first graph 224 is a luminance curve when the first dopant D1 in the first light emitting layer has a concentration of 2%, a second graph 220 is a luminance curve when the first dopant D1 in the first light emitting layer has a concentration of 4%, a third graph 226 is a luminance curve when the first dopant D1 in the first light emitting layer has a concentration of 6%, and a fourth curve 222 is a luminance curve if the first dopant D1 in the first light emitting layer has a concentration of 8%. As described above, it is understood that the slope of the luminous efficiency curve gets steeper as the amount of the dopant D1 in the first light emitting layer increases. Herein, the concentration of the first dopant D1 is considered with regard to the second host H2.

Further, Table 2 represents the second light emitting layers according to the various amounts of the second host H2 and the first dopant D1. Table 2 represents driving voltage V, luminance per unit area Cd/A, quantum efficiency QE(%), and color coordinates (CIEx, CIEy) depending on the different concentrations of the second host H2 and the first dopant D1.

TABLE 2

| Host | Dopant | Volt (V) | Cd/A | QE (%) | CIEx | CIEy | λp (nm) |
|---|---|---|---|---|---|---|---|
| BH2 | BD1 (2%) | 3.9 | 10.8 | 10.7 | 0.128 | 0.152 | 3.9 |
| | BD1 (4%) | 3.9 | 11.5 | 10.9 | 0.126 | 0.163 | 3.9 |
| | BD1 (6%) | 3.9 | 11.4 | 10.6 | 0.126 | 0.168 | 3.9 |
| | BD1 (8%) | 3.9 | 11.3 | 10.1 | 0.125 | 0.177 | 3.9 |

Further, it is understood that the slope of luminous efficiency may be varied according to the host kind as well as the amount of the dopant D1 in the first light emitting layer. Here, the second host H2 may be configured such that the charge balance is adjusted close to the optimum level, as compared to the first host H1. As described above, depending on characteristics of fluorescence, the slope of luminous efficiency may be changed by varying the concentration of the dopant, or may be changed according to host kind instead of the concentration of the dopant. This may be modified according to user needs.

Figure 9:
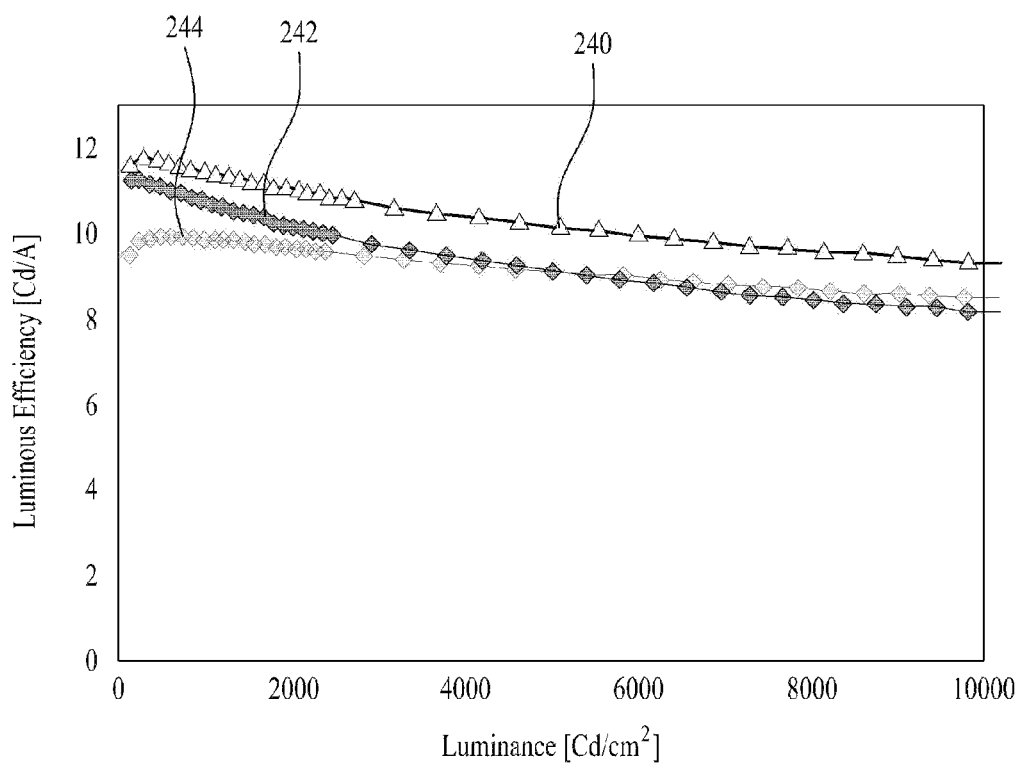
FIG. 9 is a graph illustrating luminous efficiency when the host and dopant combinations are varied.

FIG. 9 is a graph illustrating luminous efficiency when the host and dopant combinations are varied.

FIG. 9 illustrates an experimental graph using exemplary light emitting layers with the dopant concentration of 8%. In FIG. 9, a first graph 244 is a luminance curve when the first host H1 and the first dopant D1 having the concentration of 8 wt % are combined (Device B4), a second graph 242 is a luminance curve when the first host H1 and the second dopant D2 having a concentration of 8% are combined (Device B3), and a third graph 240 is a luminance curve when the second host H2 and the first dopant D1 having a concentration of 8% are combined (Device B2). As described above, the slope of the luminous efficiency curve may vary according to the dopant kind and host kind.

Further, Table 3 represents first light emitting layers according to dopant kind and host kind. Table 3 represents driving voltage V, luminance per unit area Cd/A, quantum efficiency QE(%), and color coordinates (CIEx, CIEy) of each of the first light emitting layers having characteristics of the first to third graphs.

TABLE 3

| | Host | Dopant | Volt (V) | Cd/A | QE (%) | CIEx | CIEy |
|---|---|---|---|---|---|---|---|
| Device B4 | BH1 | BD1 (8%) | 3.7 | 9.5 | 10.0 | 0.141 | 0.131 |
| Device B2 | | BD2 (8%) | 3.7 | 10.3 | 10.4 | 0.140 | 0.138 |
| Device B3 | BH2 | BD1 (8%) | 3.6 | 10.2 | 10.1 | 0.141 | 0.142 |

Figure 10:
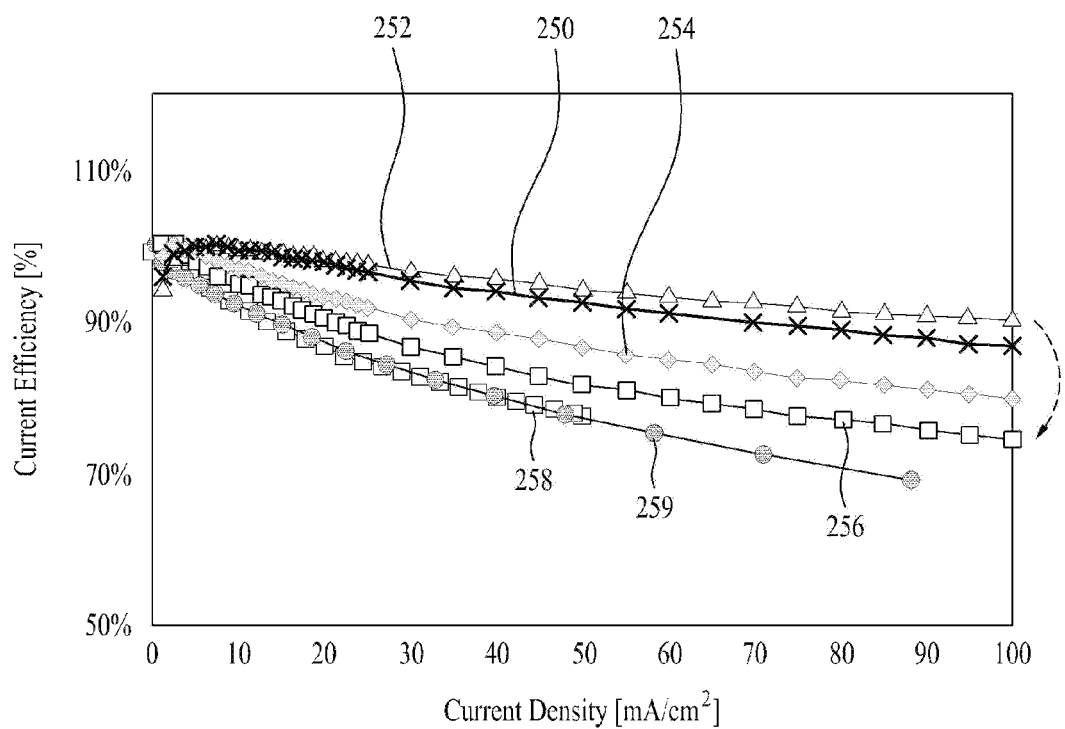
FIG. 10 is a graph illustrating luminance change slopes of respective organic light emitting devices shown in FIG. 9, an exemplary fluorescent stack, an exemplary phosphorescent stack, and a stacked white organic light emitting device.

FIG. 10 is a graph illustrating luminance change slopes of the respective organic light emitting devices shown in FIG. 9, an exemplary fluorescent stack, an exemplary phosphorescent stack and a stacked white organic emitting device.

In more detail, in FIG. 10, a first graph 256 illustrates a luminance change slope of the device B2 shown in Table 3, a second graph 254 illustrates a luminance change slope of the device B3 shown in Table 3, and a third graph 250 illustrates a luminance change slope of the device B4 shown in Table 3. Further, a fourth graph 252 illustrates a luminance change slope of the exemplary fluorescent stack, a fifth graph 259 illustrates a luminance change slope of the exemplary phosphorescent stack, and a sixth graph 258 illustrates a luminance change slope of a stacked white organic emitting device having the exemplary fluorescent stack and the exemplary phosphorescent stack.

As described above, the curve of the device B2 may be obtained by adjusting the concentration of the dopant, thus similarly generating like the curve of the exemplary phosphorescent stack. Therefore, though luminance increases or decreases, it is possible to generate no change in white color coordinates through obtaining similar slope characteristic between the device B2 and the exemplary phosphorescent stack.

As is apparent from the above description, a white organic light emitting device in accordance with the present invention can fit a change slope of a first light emitting layer (fluorescent elements) according to luminance to a change slope of a second light emitting layer (phosphorescent elements) according to luminance. Thereby, the white organic light emitting device in accordance with the present invention improves change in color coordinates according to luminance, thus having high efficiency.

Further, the white organic light emitting device in accordance with the present invention may improve the limited internal quantum efficiency of the first light emitting layer (fluorescent elements) to 25%~50% due to the delayed fluorescence through triplet-triplet annihilation (TTA), thus having high color temperature characteristics.

Further, the white organic light emitting device in accordance with the present invention may have a small change in color coordinates according to luminance using concentration quenching, thus constituting a panel without an additional algorithm.

Moreover, the white organic light emitting device in accordance with the present invention causes an electron transport layer and a hole transport layer adjacent to a light emitting layer of each stack to have a higher triplet energy level than the triplet energy level of the light emitting layer, thereby preventing diffusion of carriers.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white organic light emitting layer comprising:
   a first electrode and a second electrode opposite to each other on a substrate;
   a charge generation layer between the first electrode and the second electrode;
   a first stack including a first light emitting layer between the first electrode and the charge generation layer, wherein the first light emitting layer includes a fluorescent dopant; and
   a second stack including a second light emitting layer between the charge generation layer and the second electrode;
   wherein the fluorescent dopant has a concentration at which concentration quenching occurs in the first light emitting layer and at which a slope of a first luminous efficiency change curve of the first light emitting layer including the fluorescent dopant is fit to a slope of a second luminous efficiency change curve of the second light emitting layer at luminance values of 5000 Cd/cm2 or less,
   wherein the fluorescent dopant has the concentration at which the slope of the first luminous efficiency change curve of the first light emitting layer including the fluorescent dopant is the same as the slope of the second luminous efficiency change curve of the second light emitting layer; and
   wherein the first and second luminance efficiency change curves are according to luminance.

2. The white organic light emitting layer according to claim 1, wherein the first stack further comprises a first hole injection layer, a first hole transport layer, a second hole transport layer, and a first electron transport layer on the first light emitting layer.

3. The white organic light emitting layer according to claim 2, wherein the second stack further comprises a second hole injection layer, a third hole transport layer, and a second electron transport layer on the second light emitting layer.

4. The white organic light emitting layer according to claim 1, wherein the first light emitting layer is a light emitting layer comprising a blue fluorescent dopant in at least one host, and the second light emitting layer is a single light emitting layer formed by doping at least one host with both a red phosphorescent dopant and a green phosphorescent dopant.

5. The white organic light emitting layer according to claim 1, wherein the first light emitting layer is a light emitting layer comprising a blue fluorescent dopant in at least one host, and the second light emitting layer is a single light emitting layer formed by doping at least one host with a yellow-green phosphorescent dopant or doping one host with a green phosphorescent dopant.

6. The white organic light emitting layer according to claim 2, wherein the first electron transport layer includes at least two electron transport layers, one of the at least two electron transport layers is formed of a material minimizing diffusion of a metal from the first light emitting layer, and the other of the at least two electron transport layers is formed of an organic material enabling electron injection through doping with a metal.

7. The white organic light emitting layer according to claim 6, wherein one of the at least two electron transport layers adjacent to the first light emitting layer has a higher triplet energy level than a triplet energy level of the first light emitting layer.

8. The white organic light emitting layer according to claim 2, wherein the first hole transport layer has a higher triplet energy level than a triplet energy level of the first light emitting layer.

9. The white organic light emitting layer according to claim 3, wherein the second electron transport layer and the third hole transport layer have a higher triplet energy level than a triplet energy level of the second light emitting layer.

10. The white organic light emitting layer according to claim 1, wherein
the fluorescent dopant is from 4 wt % to 10 wt % of the first light emitting layer; and the second light emitting layer includes a phosphorescent dopant and excludes the fluorescent dopant.

11. The white organic light emitting layer according to claim 1, wherein
the first light emitting layer has a singlet-triplet exchange energy that is less than 0.6 eV and 0.1 eV or more.

12. The white organic light emitting layer according to claim 2, wherein
the triplet energy of the first electron transport layer is higher than the triplet energy of the host of the first light emitting layer.

13. The white organic light emitting layer according to claim 1, wherein the concentration quenching occurs in the first light emitting layer such that carriers collide with each other within dopant particles to thereby cause degradation of luminous efficiency.

14. A method of making a white organic light emitting layer, comprising:
providing a first electrode and a second electrode opposite to each other on a substrate;
forming a charge generation layer between the first electrode and the second electrode;
forming a first stack including a first light emitting layer between the first electrode and the charge generation layer;
forming a second stack including a second light emitting layer between the charge generation layer and the second electrode;
determining a slope of a first luminous efficiency change curve of the first light emitting layer and a slope of a second luminous efficiency change curve of the second light emitting layer;
including a fluorescent dopant in the first light emitting layer, wherein the including the fluorescent dopant includes
adjusting the concentration of the fluorescent dopant to have a concentration at which concentration quenching occurs in the first light emitting layer and at which the slope of the first luminous efficiency change curve is adjusted to be closer to the slope of the second luminous efficiency change curve,
whereby a slope of the first luminous efficiency change curve of the first light emitting layer including the fluorescent dopant is fit to the slope of the second luminous efficiency change curve of the second light emitting layer at luminance values of 5000 Cd/cm2 or less.

15. The method of claim 14, wherein the concentration quenching occurs in the first light emitting layer such that carriers collide with each other within dopant particles to thereby cause degradation of luminous efficiency.

* * * * *